United States Patent
Cowley et al.

(10) Patent No.: US 8,754,800 B2
(45) Date of Patent: Jun. 17, 2014

(54) METHODS AND ARRANGEMENTS FOR HIGH-SPEED ANALOG-TO-DIGITAL CONVERSION

(71) Applicants: Nicholas P. Cowley, Wroughton (GB); Isaac Ali, Bristol (GB); Keith Pinson, Swindon (GB); Viatcheslav I. Suetinov, Swindon (GB)

(72) Inventors: Nicholas P. Cowley, Wroughton (GB); Isaac Ali, Bristol (GB); Keith Pinson, Swindon (GB); Viatcheslav I. Suetinov, Swindon (GB)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/631,949

(22) Filed: Sep. 29, 2012

(65) Prior Publication Data
US 2014/0091960 A1    Apr. 3, 2014

(51) Int. Cl.
*H03M 1/12*      (2006.01)

(52) U.S. Cl.
CPC .................................. *H03M 1/12* (2013.01)
USPC ........................ 341/172; 341/144; 341/155

(58) Field of Classification Search
CPC ................................................ H03M 1/38
USPC ......................................... 341/144, 155, 172
See application file for complete search history.

(56) References Cited

U.S. PATENT DOCUMENTS

| | | | |
|---|---|---|---|
| 6,816,013 B2 * | 11/2004 | Kao .............................. | 330/279 |
| 6,876,319 B2 * | 4/2005 | Webster et al. ............... | 341/143 |
| 7,391,452 B2 * | 6/2008 | Itani ............................. | 348/255 |
| 7,852,254 B1 * | 12/2010 | Ginetti ......................... | 341/172 |
| 2004/0017254 A1 * | 1/2004 | Kao .............................. | 330/134 |
| 2004/0056785 A1 * | 3/2004 | Webster et al. ................ | 341/61 |
| 2004/0179118 A1 * | 9/2004 | Itani ............................. | 348/255 |

* cited by examiner

*Primary Examiner* — Jean B Jeanglaude
(74) *Attorney, Agent, or Firm* — Schubert Law Group PLLC; Jeffrey S. Schubert

(57) ABSTRACT

Logic such as hardware and/or code for high-speed analog-to-digital conversion of a signal. Logic may receive an analog signal as an input to a sampling receiver. The sampling receiver may implement a successive approximation register (SAR), analog-to-digital converter (ADC) to produce the digital output. Logic may re-task a comparator of the SAR ADC during a sampling mode to generate a digital comparator output that represents a comparison of a voltage of the charge on a capacitance of the DAC against a threshold reference voltage. The digital comparator output may be applied to the input of automatic gain control (AGC) logic. The AGC logic may receive the digital comparator signal which is representative of one sample of a multiple sample, sample cycle, allowing the AGC logic to generate a gain control signal that is responsive to both total composite average and peak amplitudes.

28 Claims, 6 Drawing Sheets

METHODS AND ARRANGEMENTS FOR HIGH-SPEED ANALOG-TO-DIGITAL CONVERSION

BACKGROUND

The present disclosure relates generally to the field of communications technologies. More particularly, the present disclosure relates to automatic gain control feedback from a charge redistribution, digital-to-analog converter in a successive approximation register, analog-to-digital converter to facilitate high-speed analog-to-digital conversion.

DETAILED DESCRIPTION OF EMBODIMENTS

Figure 1:
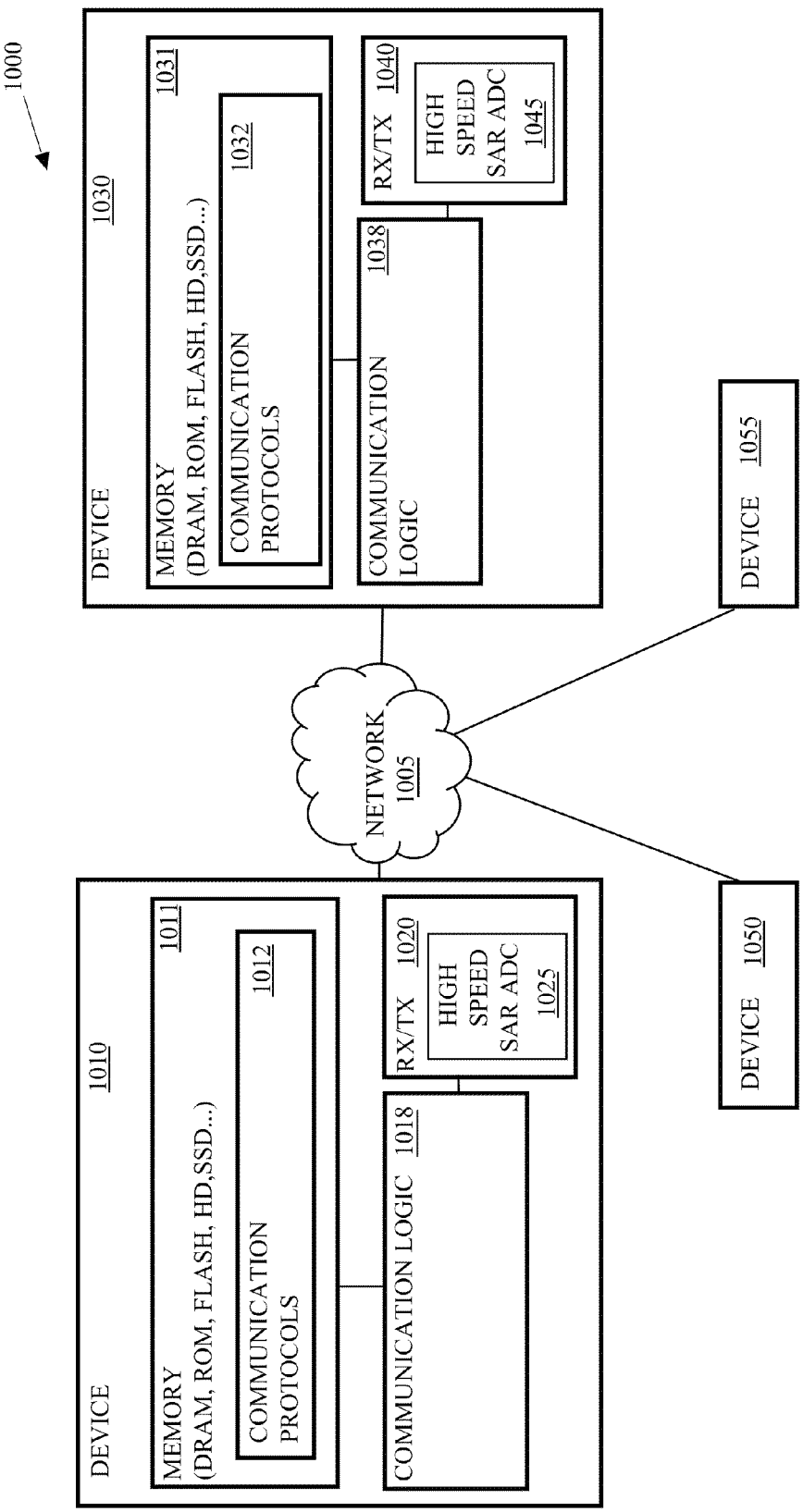
FIG. 1 depicts an embodiment of a network comprising a plurality of communications devices including wireless communications devices.

The following is a detailed description of novel embodiments depicted in the accompanying drawings. However, the amount of detail offered is not intended to limit anticipated variations of the described embodiments; on the contrary, the claims and detailed description are to cover all modifications, equivalents, and alternatives as defined by the appended claims. The detailed descriptions below are designed to make such embodiments understandable and obvious to a person having ordinary skill in the art.

Generally, embodiments for high-speed analog-to-digital conversion of signals are described herein. Embodiments may comprise logic such as hardware and/or code for high-speed analog-to-digital conversion of a signal. Many embodiments receive an analog signal as an input to a sampling receiver. The sampling receiver may implement a successive approximation register (SAR), analog-to-digital converter (ADC) to produce the digital output. In some embodiments, the SAR ADC may be single-ended. In further embodiments, the SAR ADC may implement a differential digital-to-analog (DAC) design or an interleaved SAR ADC design.

Embodiments may re-task a comparator of the SAR ADC during a sampling mode to generate a digital comparator output that represents a comparison of the charge on a capacitance of the DAC against a threshold reference voltage. In many embodiments, the threshold reference voltage may be the maximum input voltage that can be applied to the input of the comparator and reliably maintain linear operation of the SAR ADC.

In further embodiments, the digital comparator output is applied to the input of automatic gain control (AGC) logic. The AGC logic receives the digital comparator signal which is representative of one sample of a multiple sample, sample cycle, allowing the AGC logic to generate a gain control signal that is responsive to both total composite average and peak amplitudes. This is responsive to both desired signal amplitude and more importantly to both the amplitude and offset frequency of any undesired 'blocking' signal amplitude. In other words, the AGC logic may monitor each sample point during a sample cycle so the AGC logic can base the gain control signal on the number of samples taken as well as the particular part of the sample cycle. In many embodiments, the AGC logic may generate the gain control to adjust for the various peaks and troughs during each of the samples at different points of the sample cycle.

Various embodiments may be designed to address different technical problems associated with high-speed analog-to-digital conversions. For instance, many embodiments may be designed to address the amplitude attenuation of samples resulting from phase differences between the input signal and the sampling clock that manifest as an increase the offset frequency of the input signal with respect to the sampling clock as well as the offset frequency of the input signal with respect to interfering signal(s). These technical problems may manifest as peaks and troughs in samples throughout the sample cycle, the RF filter characteristic that attenuates undesired channels at a rate dependent on frequency offset, and the like.

Different technical problems such as those discussed above may be addressed by one or more different embodiments. For instance, some embodiments that are designed to address the variation in amplitude during the multiple samples may do so by one or more different technical means such as generating a digital comparator signal indicative of the amplitude and frequency offset for each sample and generating a gain control signal responsive to both the total composite average and peak amplitudes of the samples throughout the sample cycle.

Some embodiments may take advantage of Wireless Fidelity (Wi-Fi) network ubiquity, enabling new applications that often require very low power consumption, among other unique characteristics. Wi-Fi generally refers to devices that implement the IEEE 802.11-2007, IEEE Standard for Information technology—Telecommunications and information exchange between systems—Local and metropolitan area networks—Specific requirements—Part 11: Wireless LAN Medium Access Control (MAC) and Physical Layer (PHY) Specifications (http://standards.ieee.org/getieee802/download/802.11-2007.pdf) and other related wireless standards.

Several embodiments comprise access points (APs), stations (STAs), routers, switches, servers, workstations, netbooks, mobile devices (Laptop, Smart Phone, Tablet, and the like), wireless or wired receivers, sampling receiver integrated circuits, system-on-chips (SoCs), chip packages, as well as test equipment, instruments, monitors, and the like.

Logic, modules, devices, and interfaces herein described may perform functions that may be implemented in hardware or hardware and code. Hardware and/or code may comprise software, firmware, microcode, processors, state machines, chipsets, or combinations thereof designed to accomplish the functionality.

Some embodiments may facilitate wireless communications. Some embodiments may comprise wireless communications like Bluetooth®, wireless local area networks (WLANs), wireless metropolitan area networks (WMANs), wireless personal area networks (WPAN), cellular networks, communications in networks, messaging systems, and smart-devices to facilitate interaction between such devices. Furthermore, some wireless embodiments may incorporate a single antenna while other embodiments may employ multiple antennas. For instance, multiple-input and multiple-output (MIMO) is the use of radio channels carrying signals via multiple antennas at both the transmitter and receiver to improve communication performance.

While some of the specific embodiments described below will reference the embodiments with specific configurations, those of skill in the art will realize that embodiments of the present disclosure may advantageously be implemented with other configurations with similar issues or problems.

Turning now to FIG. 1, there is shown an embodiment of a communication system 1000. The communication system 1000 comprises a communications device 1010 that may be wired and/or wirelessly connected to a network 1005. The communications device 1010 may communicate with a plurality of communication devices 1030, 1050, and 1055 via the network 1005. The communications device 1010 may comprise, e.g., a Wi-Fi router or a wireless receiver for a television signal. The communications device 1030 may comprise a communications device such as a router to capture and re-transmit the wireless communications to/from communications devices 1050 and 1055 and from/to communications device 1010. Communications devices 1050 and 1055 may comprise sensors, stations, access points, hubs, switches, routers, computers, laptops, netbooks, cellular phones, smart phones, PDAs (Personal Digital Assistants), or other network-capable devices.

In other embodiments, communications devices 1010 and 1030 may represent test equipment at or for a manufacturing facility to test ultra-high speed communications. For example, communications device 1010 may comprise a high speed, successive approximation register (SAR) analog-to-digital converter (ADC) 1025 in a receiver of a transmitter/receiver 1020 to convert analog transmission from communications device 1030. The communications device 1030 may also comprise a high speed SAR ADC 1045 as part of a receiver/transmitter 1040 to receive high-speed communications from the communications device 1010.

The communications device 1010 may begin to receive a communication from the communications device 1030 via the network 1005 either wired or wirelessly, or, alternatively through a direct wired connection between the RX/TX 1040 and RX/TX 1020. The high speed SAR ADC 1025 may reside at or near the front end of the receiver of RX/TX 1020. In some embodiments, the high speed SAR ADC 1025 may be a single-ended, single SAR DAC that operates at a very high clocking frequency for the communication from the communications device 1030. In many embodiments, the high speed SAR ADC 1025 conversion rate will be a sub harmonic of the carrier frequency where the sub harmonic ratio may be related to the number of input samples the SARADC process in each conversion.

In many embodiments, more than one SAR ADCs may be time interleaved and may comprise a data combiner to interleave the outputs of each of the individual SAR ADCs operating in parallel. In some embodiments, the high speed SAR ADC 1025 may comprise one or more differential SAR ADCs operating in parallel to convert the analog signal of the communication to a digital signal.

The high speed SAR ADC 1025 may receive the analog signal as an input signal. During the process of conversion, a charge redistribution (CR), digital-to-analog (DAC) of the high speed SAR ADC 1025 may store a charge equivalent to the voltage amplitude of a sample (or samples) of the input signal in capacitance of the CR DAC. A comparator coupled with the CR DAC may compare the voltage of the charge stored in the capacitance against a threshold reference voltage, the sampling mode reference voltage, for the comparator to determine whether the voltage of the charge stored in the capacitance is less than or greater than the sampling mode reference voltage for the comparator. If the voltage of the charge stored in the capacitance is less than the sampling mode reference voltage, the comparator may output a digital comparator signal such as a logical zero to represent that the amplitude of the input signal is less than the maximum amplitude for the input signal. In many embodiments, the sampling mode reference voltage may be the maximum voltage for a charge stored in the capacitance that allows the high speed SAR ADC 1025 to remain within linear operation.

On the other hand, if the voltage of the charge stored in the capacitance is greater than the sampling mode reference voltage, the comparator may output a digital comparator signal such as a logical one to represent that the amplitude of the input signal is greater than the maximum amplitude for the input signal.

An automatic gain control (AGC) logic may receive the digital comparator output and generate a gain control signal based upon the sample represented by the signal as well as additional information that can be determined from digital comparator signals from multiple samples. In particular, as a result of the use of the charge from the CR DAC in a comparison against the optimal amplitude for the input of the comparator, the accumulation of digital representations of multiple samples with the known number of samples in a sample cycle, the AGC logic can determine the number of samples taken in a sample cycle, the offset amplitudes of undesired signals in the composite spectrum, the peak amplitudes within the samples of the sample cycle, and the composite average amplitudes across the samples and the sample cycle.

Once the high speed SAR ADC 1025 converts the communication or part thereof, the signal may be decoded. After decoding the communication, the communications device may comprise a higher layer, communication logic 1018 to interpret the communication from the communications device 1030 using communication protocols 1012 stored in memory of the communications device 1010.

In the present embodiment, the communications device 1030 may have similar hardware including a communication logic 1038 that implements communication protocols 1032 in memory 1031 to generate the communications for transmission and to interpret communications received. The memory 1011 and 1031 may comprise a storage medium such as Dynamic Random Access Memory (DRAM), read only memory (ROM), buffers, registers, cache, flash memory, hard disk drives, solid-state drives, or the like. The memory 1011 and 1031 may store the one or more communications protocols, packet structures, frames such as the management, control, and data frames and/or the frame structures including fields, and/or the like. In some embodiments, the memory 1011 and 1031 may store the frames comprising fields based upon the structure of the standard frame structures identified in IEEE 802.11.

In further embodiments, the communications device 1010 may facilitate data offloading. For example, communications devices that are low power sensors may include a data offloading scheme to, e.g., communicate via Wi-Fi, another communications device, a cellular network, or the like for the purposes of reducing power consumption consumed in waiting for access to, e.g., a metering station and/or increasing availability of bandwidth. Communications devices that receive data from sensors such as metering stations may include a data offloading scheme to, e.g., communicate via Wi-Fi, another communications device, a cellular network, or the like for the purposes of reducing congestion of the network 1005.

The network 1005 may represent an interconnection of a number of networks. For instance, the network 1005 may couple with a wide area network such as the Internet or an intranet and may interconnect local devices wired or wirelessly interconnected via one or more hubs, routers, or switches. In the present embodiment, network 1005 communicatively couples communications devices 1010, 1030, 1050, and 1055.

FIG. 1 may depict a number of different embodiments including a Multiple-Input, Multiple-Output (MIMO) system with, e.g., four spatial streams, and may depict degenerate systems in which one or more of the communications devices 1010, 1030, 1050, and 1055 comprise a receiver and/or a transmitter with a single antenna including a Single-Input, Single Output (SISO) system, a Single-Input, Multiple Output (SIMO) system, and a Multiple-Input, Single Output (MISO) system.

Figure 1A:
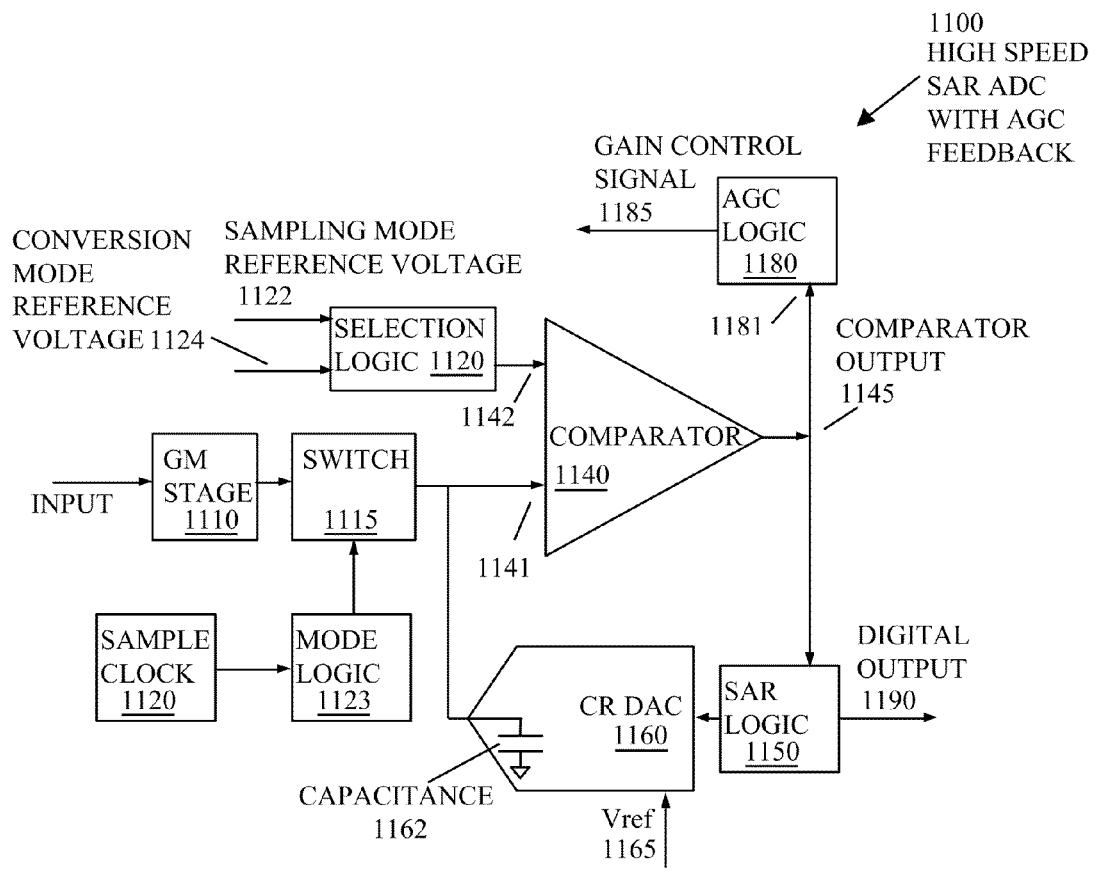
FIG. 1A depicts an embodiment of an apparatus for a successive approximation register, analog-to-digital converter of the high-speed analog-to-digital converter illustrated in FIG. 1.

FIG. 1A depicts an embodiment of a high-speed SAR ADC 1100 for the high-speed SAR ADC 1025 and 1045 illustrated in FIG. 1. Many embodiments have been developed to facilitate implementation of very high speed ADCs as are required, for example, in communication systems. Several embodiments may be particularly advantageous for wide channel bandwidths as are applied in, for example, high definition video and audio transmissions.

The high-speed SAR ADC 1100 may operate in two modes, a sampling mode and a conversion mode. And the high-speed SAR ADC 1100 may switch between the two modes of operation based upon the frequency of the sampling clock 1120 and the number of samples averaged during the sampling mode. Mode logic 1123 receives the sampling clock 1120 as an input and coordinates the timing of cycles between the two modes of operation. For example, in sampling mode two or more samples may be taken via switch 1115 and in conversion mode, the stored charge/voltage may be converted into a digital word. This would normally occur over two or more cycles of the sample clock.

At the transition from the prior conversion mode of operation to the sampling mode of operation, the selection logic 1120 may change the state of the switch 1115 to apply the input signal 1105 to a capacitance 1162, which may be all or part of the capacitance within the charge redistribution, digital-to-analog converter (CR DAC) 1160 and not the external capacitance in parallel with the internal CR DAC 1160 capacitance. For the purposes of clarity of the discussion herein, the internal capacitance 1162 of the DAC or the capacitance of the DAC may refer to either all or part of the internal CR DAC 1160 capacitance that takes part in successive approximation conversion and the "external capacitance" may refer to the external capacitance that may be used to supplement the internal capacitance 1162 of the CR DAC 1160. Also, at the transition from the prior conversion mode of operation, the selection logic 1120 may change states to apply the sampling mode reference voltage 1122 to the input 1142 of the comparator 1140.

During the sampling mode, the high-speed SAR ADC 1100 samples a charge proportional to the input signal 1105 from the input signal via the GM stage 1110 and the switch 1115. In particular, the GM stage 1110 may convert the voltage of the input signal 1105 to a current and the current may flow through the switch 1115 into a capacitance 1162 of the CR DAC 1160, which may store charges in the capacitors of a capacitor bank internal to the CR DAC 1160. The capacitors receive charges related to their capacitance.

The voltage generated by the charge on the capacitance 1162 of the CR DAC 1160 may also be coupled with the input 1141 of the comparator 1140 during the sampling phase. The comparator 1140 may compare the sampling mode reference voltage with the voltage generated by the charge on the capacitance 1162 of the CR DAC 1160. Comparing the sampling mode reference voltage against the voltage generated by the charge on the capacitance 1162 may determine whether the amplitude of the sample of the input voltage is lower than the maximum designed, or rated, input voltage or greater than the maximum designed input voltage for linear operation. For situations in which voltage generated by the charge on the capacitance 1162 of the CR DAC 1160 is lower than the maximum designed input voltage, the comparator 1140 may output a digital comparator signal indicative of the low voltage at the input of the SAR ADC 1100. On the other hand, if the voltage generated by the charge on the capacitance 1162 is higher than the maximum designed input voltage, the comparator 1140 may output a digital comparator signal indicative of the high voltage at the input of the SAR ADC 1100.

In many embodiments, the output of the comparator 1145 couples with an input 1181 of automatic gain control logic 1180. The automatic gain control logic 1180 can take advantage of the low overhead required to utilize a digital signal like the digital comparator signal to determine a gain control signal 1185, allowing the AGC logic 1180 to have, in some embodiments, fully digital parametric control of the AGC characteristics. In the present embodiment, the AGC logic 1180 outputs the gain control signal 1185 responsive to the digital comparator signal as well as the total composite amplitude of the voltage amplitude input to the comparator 1140 over repeated sampling.

At the next clock cycle from the mode logic 1122, which demarks the change in the mode of operation of the high speed SAR ADC 1100 from the sampling mode to the conversion mode, the switch 1115 changes states, which stops passing samples of charge to the capacitance 1162 of the CR DAC 1160 and, in some embodiments, when changing states, the output of the switch 1115 is isolated from the capacitance 1162 of the CR DAC 1160. At the change of states, the selection logic 1120 changes states to select the conversion mode reference voltage 1124 to couple with the input 1142 of the comparator 1140. The conversion mode reference voltage may be, e.g., half the voltage of the amplitude of the input signal 1105 and the comparator 1140 may output a digital comparator signal 1145 comprising a logical one if the charge on a capacitor internal to the CR DAC 1160 is greater than the voltage of the conversion mode reference voltage 1124 or a logical zero if the charge on the capacitor is less than the voltage of the conversion mode reference voltage 1124. In many embodiments, the conversion mode reference voltage comprises a threshold voltage for bit decisions.

Capacitors of the internal capacitor bank of the CR DAC 1160 are switched so that the charge on some or all of the capacitors are applied across the comparator's input 1141, creating a comparator input voltage equal to a negative of the voltage of the input signal sampled (−Vin). Note that the charge flow into the capacitance 1162 from the switch 1115 may include flow into some or all of the internal capacitor bank within CR DAC 1160 and also may include flow into the external capacitance in parallel with the internal capacitance. In the former case, the unused elements of the capacitor bank may be shorted with the used elements prior to conversion. In the latter case, the external capacitance may be isolated from the capacitor bank before conversion. In addition, the external capacitance may or may not be shorted after isolation and before being switched back in parallel with the capacitor bank for the next sampling cycle.

Then actual conversion process proceeds. First, the most significant bit (MSB) capacitor internal to the CR DAC 1160 is switched to Vref 1165, which corresponds to the full-scale range of the SAR ADC 1100. Due to binary weighting of the capacitor bank, the MSB capacitor forms a 1:1 divided between it and the rest of the array. Thus, the input voltage to the comparator is −Vin plus Vref/2. Subsequently, if Vin is greater than Vref/2, the comparator 1140 outputs a logical 1 as the MSB, otherwise it outputs a logical 0 as the MSB. Each capacitor that stores charge from the GM stage 1110 in the capacitor bank of the CR DAC 1160 is tested in the same manner until the comparator 1140 input voltage converges to an offset voltage, or at least as close as possible given the resolution of the CR DAC 1160. The offset voltage is the initial charge placed on the capacitors of the capacitor bank prior to sampling the input signal 1105.

Figure 1B:
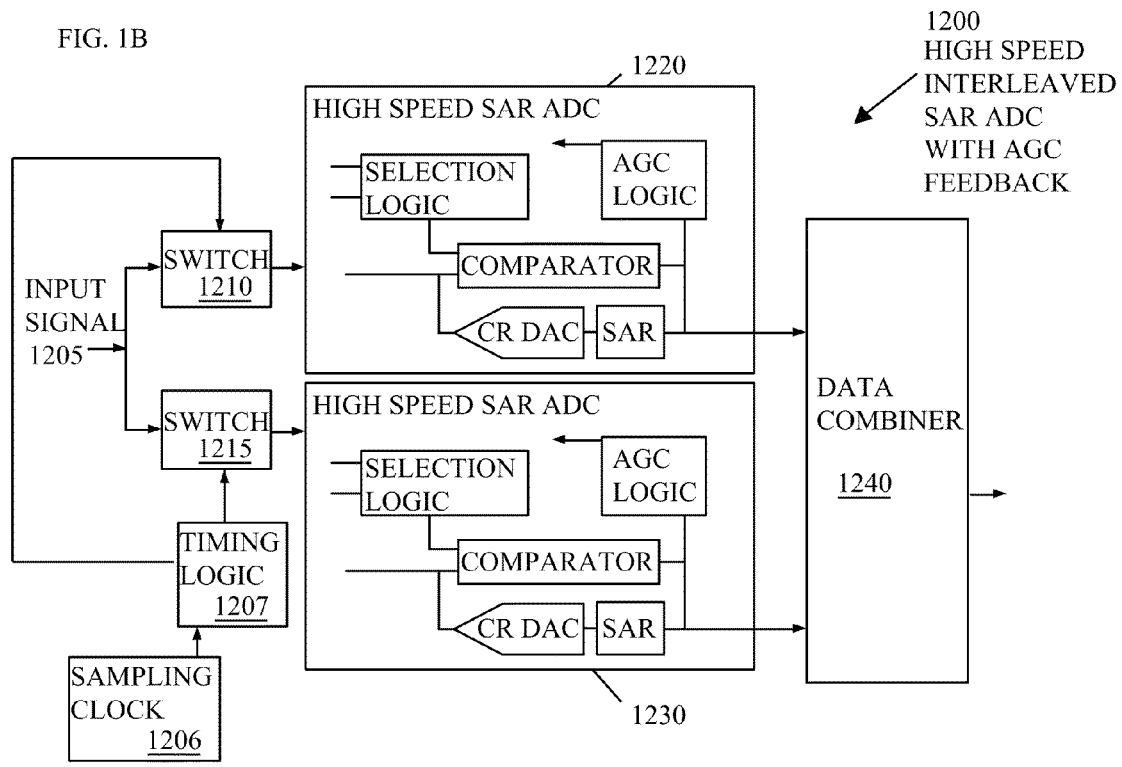
FIG. 1B depicts an embodiment of a time interleaved, successive approximation register, analog-to-digital converter of the high-speed analog-to-digital converter illustrated in FIG. 1.

FIG. 1B depicts an embodiment of a high speed, interleaved SAR ADC 1200 with AGC feedback for the high-speed SAR ADCs 1025 and 1045 illustrated in FIG. 1. The high speed, interleaved SAR ADC 1200 illustrates High Speed SAR ADCs 1220 and 1230, each of which comprises similar features of those in the SAR ADC 1100 in FIG. 1A and/or those illustrated in FIG. 1C. The depiction of two parallel SAR ADCs 1220 and 1230 is for illustration purposes. Interleaved embodiments can have any number of two or more time interleaved SAR ADCs such as SAR ADCs 1220 and 1230.

In the present embodiment, the input signal 1205 is divided into two of more parallel paths as input to a plurality of switches 1210 and 1215, each of which is associated with a SAR ADC (1220 and 1230, respectively). The switches 1210 and 1215 may be controlled by the timing logic 1207 to effectively multiplex the input signals to the high speed SAR ADCs 1220 and 1230. The sampling clock 1206 provides a reference frequency to the timing logic 1207 for changing the modes of operation of the high speed SAR ADCs 1220 and 1230 and the data combiner 1240 at the outputs of the high speed SAR ADCs 1220 and 1230 recombine the output signals to generate an interleaved output signal. In other embodiments, time multiplexing may occur at the output of the high speed SAR ADCs 1220 and 1230 or within the high speed SAR ADCs 1220 and 1230. Still other embodiments may employ other means for multiplexing.

Figure 1C:
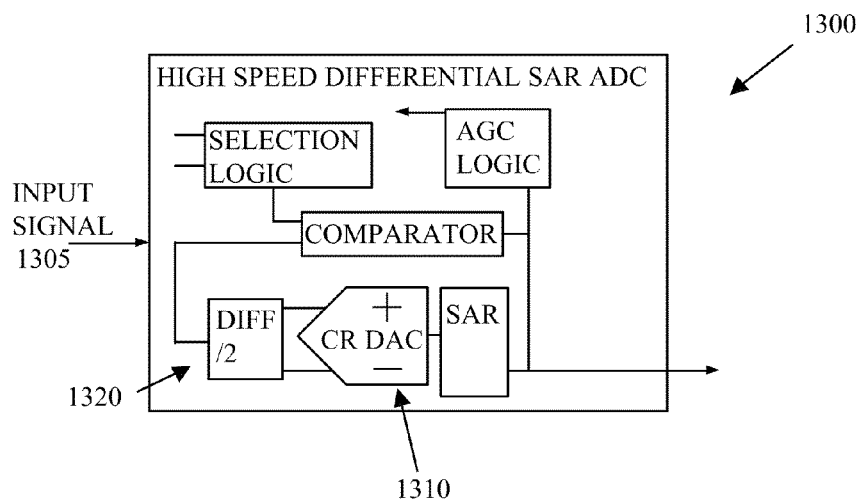
FIG. 1C depicts an embodiment of a differential, successive approximation register, analog-to-digital converter of the high-speed analog-to-digital converter illustrated in FIG. 1.

FIG. 1C depicts an embodiment of a high speed, differential SAR ADC 1300 with AGC feedback for the high-speed SAR ADCs 1025 and 1045 illustrated in FIG. 1. The high speed, differential SAR ADC 1300 illustrates a High Speed SAR ADC that comprises similar features of those in the SAR ADC 1100 in FIG. 1A. The differences include the differential DAC 1310 including the positive CR DAC output and the negative CR DAC output. The differences also include DIFF/2 1320 between the differential CR DAC outputs and the input of the comparator. DIFF/2 1320 determines a voltage that is half of the difference between the voltages of the positive and negative charges on the capacitance of the CR DAC and applies this to the input of the comparator for comparison against the conversion mode voltage.

Alternative embodiments may comprise a differential comparator to compare the voltage of the negative charge against a negative reference and the voltage of the positive charge against a positive voltage reference. Thus, in the conversion mode, the selection logic may apply a negative conversion mode reference voltage and a positive conversion mode reference voltage to negative and positive reference inputs of the comparator, respectively. During the sampling mode, the selection logic may apply a negative sampling mode reference voltage and a positive sampling mode reference voltage to negative and positive reference inputs of the comparator, respectively. Many embodiments are implemented in various other differential arrangements.

Figure 1D:
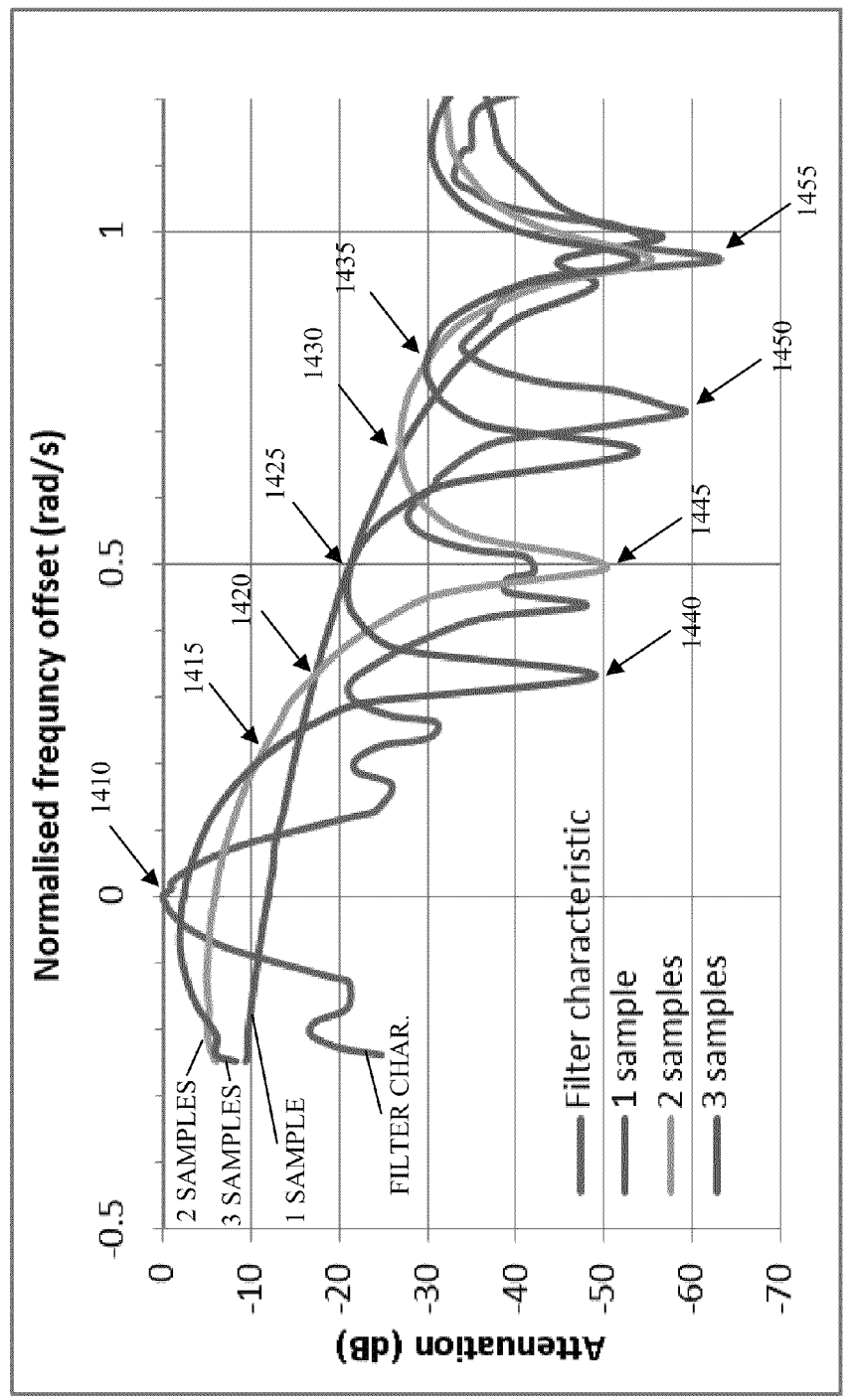
FIG. 1D depicts an embodiment of a graph illustrating the amplitudes of samples of voltages from a capacitance of a charge redistribution, digital-to-analog converter through four sample periods.

FIG. 1D depicts an embodiment of a graph 1400 illustrating the amplitudes of samples of voltages from a capacitance of a charge redistribution, digital-to-analog converter through four sample periods to illustrate the issue with peak instantaneous power that the AGC logic addresses in the generation of the gain control signal based upon the digital comparator signals for each charge sample over the sampling period. The graph 1400 compares the amplitude for a four tap (four sample) finite impulse response (FIR) RF Filter with the corresponding relative peak amplitude after successive charge sample periods. The x-axis is normalized frequency offset from the carrier at 1 rad/sec and the input amplitude is constant with offset normalized at the output the Filter response.

For small frequency offsets to the center of the filter passband, the amplitude increases with number of samples since the charge samples are effectively correlated and similar in magnitude (since the sample frequency is much higher than the frequency offset). With increasing frequency offset, the samples become a more significant fraction therefore successive samples start to cancel each other, hence a single sample may have a lower amplitude than the sum of two or three samples as can be seen, for example, at an offset frequency of 0.225 rad/sec 1415, an offset frequency of 0.4 rad/sec 1420, an offset frequency of 0.7 rad/sec 1430, and an offset frequency of 0.8 rad/sec 1435.

The instantaneous amplitude during the sampling period varies on a sample-by-sample basis and furthermore the sample count corresponding to the largest peak amplitude varies by frequency offset and that the relative amplitude varies by frequency offset. See, for example the peaks at 0.0 rad/sec 1410, 0.5 rad/sec 1425, and 0.8 rad/sec 1435.

The digital gain control loop including the re-tasking of the comparator during the sampling mode to generate a digital comparator signal feedback and the inclusion of the AGC logic to generate the gain control signal as feedback by monitoring the comparator output may act to set the gain such that the reference and peak amplitude are substantially equal. Thus, the AGC logic may generate a gain control signal that compensates for the instantaneous troughs also such as the troughs 1440, 1445, 1450, and 1455, and also for the peaks 1410, 1415, 1425, 1430, and 1435. Being aware of the presence of the instantaneous peaks during the sampling period may allow the AGC logic to generate a gain control signal that would help to avoid saturation and hence help to avoid distortion due to the instantaneous amplitude.

Figure 2:
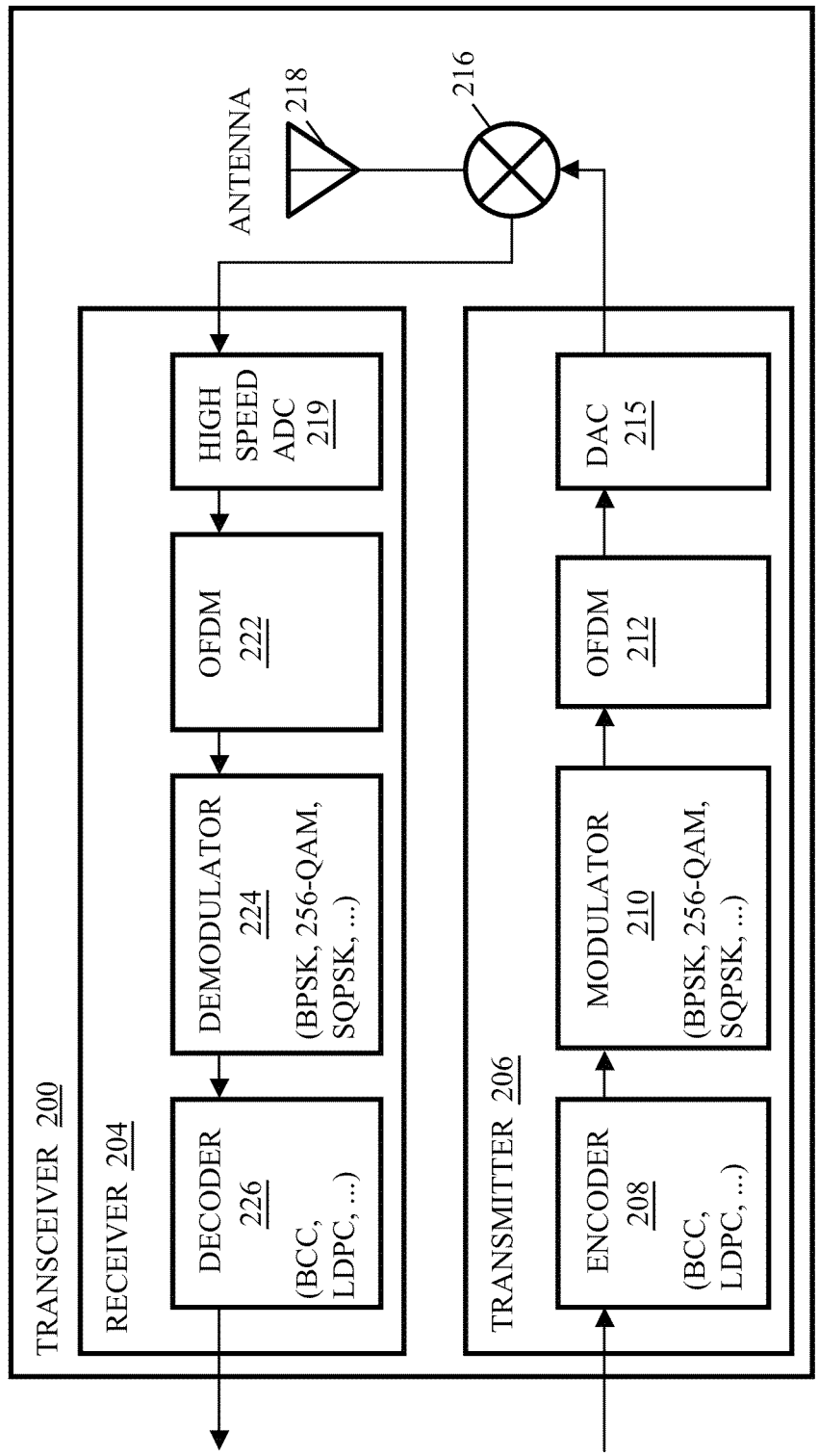
FIG. 2 depicts an embodiment of an apparatus with high-speed analog-to-digital conversion of signals.

FIG. 2 depicts an embodiment of an apparatus to generate, communicate, transmit, receive, communicate, and interpret a frame with high-speed analog-to-digital conversion of signals. The apparatus comprises a transceiver 200. The transceiver 200 comprises a receiver 204 and a transmitter 206. The transmitter 206 may comprise one or more of an encoder 208, a modulator 210, an OFDM 212, and a DAC 215. The encoder 208 of transmitter 206 receives and encodes data destined for transmission from, e.g., a MAC sublayer with, e.g., a binary convolutional coding (BCC), a low density parity check coding (LDPC), and/or the like. The modulator 210 may receive data from encoder 208 and may impress the received data blocks onto a sinusoid of a selected frequency via, e.g., mapping the data blocks into a corresponding set of discrete amplitudes of the sinusoid, or a set of discrete phases of the sinusoid, or a set of discrete frequency shifts relative to the frequency of the sinusoid. The output of modulator 210 is fed to an orthogonal frequency division multiplexer (OFDM) 212, which impresses the modulated data from modulator 210 onto a plurality of orthogonal sub-carriers.

The OFDM 212 may encode digital data on multiple carrier frequencies. OFDM is a frequency-division multiplexing scheme used as a digital multi-carrier modulation method. A large number of closely spaced orthogonal sub-carrier signals are used to carry data. The data is divided into several parallel data streams or channels, one for each sub-carrier. Each sub-carrier is modulated with a modulation scheme at a low symbol rate, maintaining total data rates similar to conventional single-carrier modulation schemes in the same bandwidth.

The DAC 215 may receive a data stream from the OFDM 212 and convert the data stream to an analog signal for transmission via the antenna array 218. The transceiver 200 may also comprise diplexers 216 connected to antenna 218. Thus, in this embodiment, a single antenna is used for both transmission and reception. When transmitting, the signal passes through diplexers 216 and drives the antenna with the up-converted information-bearing signal. During transmission, the diplexers 216 prevent the signals to be transmitted from entering receiver 204. When receiving, information bearing signals received by the antenna array pass through diplexers 216 to deliver the signal from the antenna array to receiver 204. The diplexers 216 then prevent the received signals from entering transmitter 206. Thus, diplexers 216 operate as switches to alternately connect the antenna to the receiver 204 and the transmitter 206.

The antenna 218 radiates the information bearing signals into a time-varying, spatial distribution of electromagnetic energy that can be received by an antenna of a receiver. The receiver can then extract the information of the received signal.

The transceiver 200 may comprise a receiver 204 for reception, analog-to-digital conversion, demodulation, and decoding of information bearing signals. The receiver 204 may comprise one or more of a high speed, SAR ADC 219, a DBF 220, an OFDM 222, a demodulator 224 and a decoder 226. The received signals are fed from antenna elements 218, converted from analog to digital at the SAR ADC 219. For example, the SAR ADC 219 may receive the analog input signal and the analog input signal may be switched to alternate between sampling modes for a capacitance of the CR DAC and conversion modes of the CR DAC. In many embodiments, during the sampling cycles, the capacitor bank of the CR DAC may receive the voltage input of the input signal as a current to store the energy of the input signal in the capacitance of the CR DAC. During the conversion mode, the voltage of the charge of the capacitance of the CR DAC, which may be a negative of the input charge, is applied to the input of a comparator. And a successive approximation register (SAR) logic may begin conversion.

During the sampling mode, the voltage of the charge on the capacitance of the CR DAC, which may be equivalent to the voltage amplitude of the input signal, is compared against a sampling mode reference voltage that effectively compares the voltage of the input signal, or a voltage proportional thereto, against the maximum voltage at which the comparator is designed to receive the input signal, or a voltage at which the SAR ADC would efficiently operate to perform the analog-to-digital conversion.

The comparator then outputs a digital comparator signal that indicates whether the voltage of the input signal is above or below the sampling mode reference voltage. And AGC logic monitors the digital comparator signal to generate a gain control signal that is responsive to both the total composite average and peak amplitudes of the voltage of the input signal.

The OFDM 222 extracts signal information from the plurality of subcarriers onto which information-bearing signals are modulated. The demodulator 224 demodulates the received signal, extracting information content from the received signal to produce an un-demodulated information signal. And, the decoder 226 decodes the received data from the demodulator 224 and transmits the decoded information, the MPDU, to the MAC sublayer logic 201.

Persons of skill in the art will recognize that a transceiver may comprise numerous additional functions not shown in FIG. 2 and that the receiver 204 and transmitter 206 can be distinct devices rather than being packaged as one transceiver. For instance, embodiments of a transceiver may comprise a Dynamic Random Access Memory (DRAM), a reference oscillator, filtering circuitry, synchronization circuitry, an interleaver and a deinterleaver, possibly multiple frequency conversion stages and multiple amplification stages, etc. Further, some of the functions shown in FIG. 2 may be integrated. For example, digital beam forming may be integrated with orthogonal frequency division multiplexing. In some embodiments, for instance, the transceiver 200 may comprise one or more processors and memory including code to perform functions of the transmitter 206 and/or receiver 204.

Figure 3:
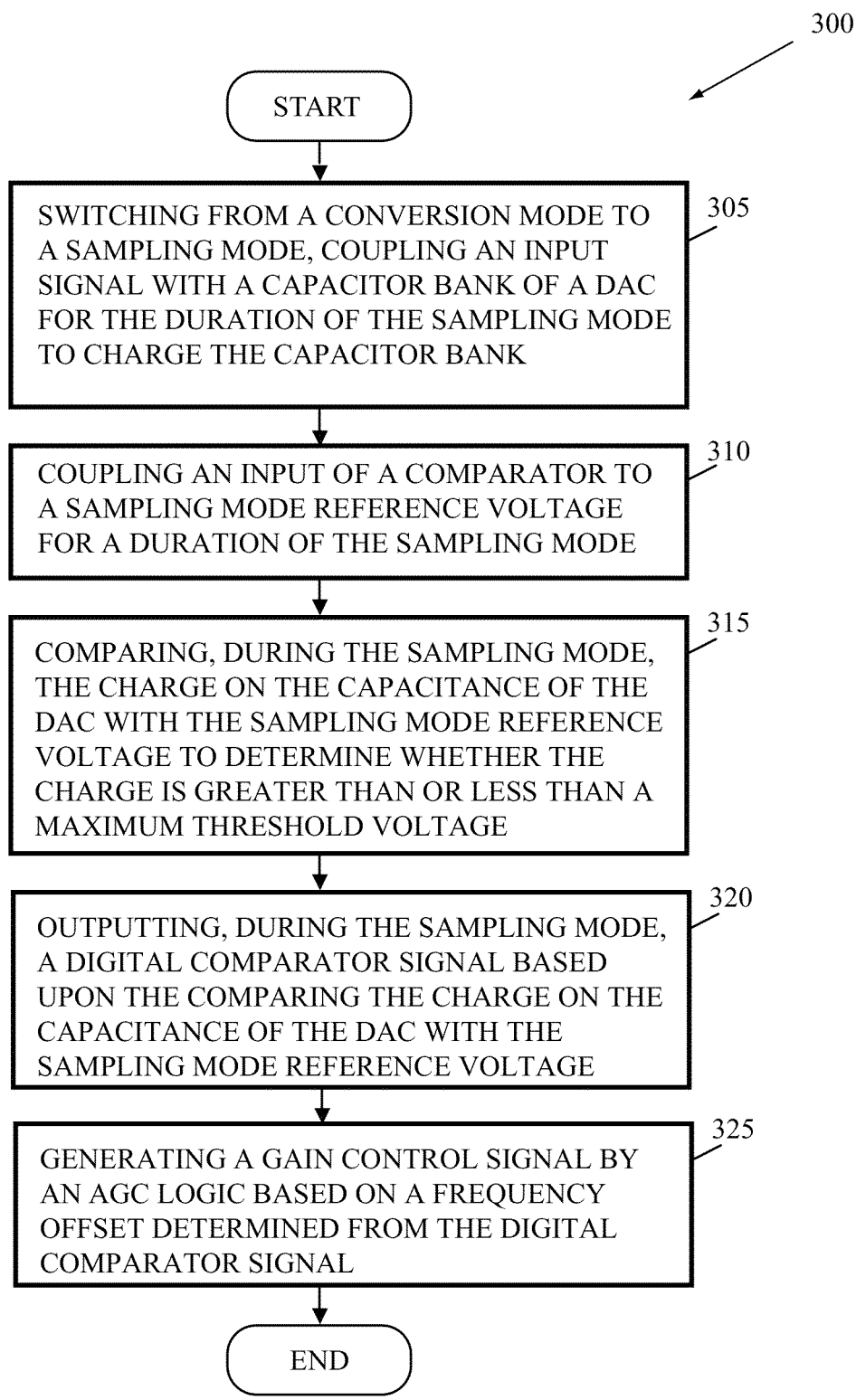
FIG. 3 depicts an embodiment of a flowchart for high-speed analog-to-digital conversion of signals as illustrated in FIG. 1A.

FIG. 3 depicts an embodiment of a flowchart 300 for high-speed analog-to-digital conversion of signals such as one of the high speed, SAR ADCs described in conjunction with FIGS. 1-2. The flowchart 300 begins with switching from conversion mode to a sampling mode, coupling an input signal with a capacitance of a DAC for the duration of the sampling mode to charge the capacitor bank (element 305). In many embodiments, coupling the input signal with the capacitance may involve coupling a GM stage with the capacitance to convert the voltage of the input signal at the GM stage to a current so the charge can flow into the capacitance.

Many embodiments couple, by a selection logic, an input of a comparator to a sampling mode reference voltage for a duration of the sampling mode, wherein the sampling mode reference voltage comprises a threshold voltage for the voltage on the charge on the capacitance at the input of the comparator (element 310). In some embodiments, coupling comprises switching, in a single-ended, successive approximation register, analog-to-digital converter, the reference voltage input of the comparator. In some embodiments, coupling comprises switching, in a differential, successive approximation register, analog-to-digital converter, the reference voltage input of the comparator from the output of one of the differential DACs. In further embodiments, coupling comprises switching, in an interleaved, successive approximation register, analog-to-digital converter, the reference voltage input of the comparator from the conversion mode reference voltage.

After coupling the reference voltage to the comparator, many embodiments may comprise comparing, during the sampling mode, the voltage of the charge on the capacitance of the digital-to-analog converter with the sampling mode reference voltage to determine whether the voltage of the charge is greater than or less than the threshold voltage (element 315). In some embodiments, the threshold voltage may be the maximum voltage acceptable for input to the comparator for linear operation of the SAR ADC. In such embodiments, the charge on the capacitor is effectively facilitating the comparison of the instantaneous input voltage with a input voltage for which the comparator was designed so the comparator can detect whether the gain applied to the input signal is sufficient at that sampling point or whether the gain at that sampling point is excessive, causing the input voltage to surpass the rated input voltage for the comparator.

After comparing the charge against the sampling mode reference voltage, the comparator may output, during the sampling mode, a digital comparator signal based upon the comparing the voltage of the charge on the capacitance of the digital-to-analog converter with the sampling mode reference voltage (element 320). The digital comparator signal may represent the relationship between the rated or specified voltage for the input of the comparator and the actual voltage at the input for the sample.

The digital comparator signal may be monitored by AGC logic and the AGC logic may generate a gain control signal based upon a frequency offset between a sampling clock frequency of the SAR ADC and an input signal frequency of the input signal (element 325). In many embodiments, the frequency offset may be determined based upon the digital comparator signal. In some embodiments, generating the gain control signal by the automatic gain control logic comprises generating the gain control signal based upon a number of samples taken during a period of a sampling cycle. In many embodiments, generating the gain control signal by the automatic gain control logic comprises generating the gain control based upon a number of samples that have been determined at a point during a sampling cycle. Further embodiments may comprise generating a gain control signal by an automatic gain control logic based upon the digital comparator signal, wherein the gain control signal is responsive to the total composite average and peak amplitudes of the input signal as sampled by the digital-to-analog converter.

The following examples pertain to further embodiments. One example comprises a method to generate feedback for automatic gain control. The method may involve switching a successive approximation register, analog-to-digital converter from a conversion mode, to couple an input signal of the successive approximation register, analog-to-digital converter with a capacitance of a digital-to-analog converter during a sampling mode to charge the capacitance of the digital-to-analog converter in the sampling mode; coupling, by a selection logic, an input of a comparator to a sampling mode reference voltage for a duration of the sampling mode, wherein the sampling mode reference voltage comprises a threshold voltage for the voltage of a charge on the capacitance of the digital-to-analog converter at the input of the comparator; comparing, during the sampling mode, a voltage of the charge on the capacitance of the digital-to-analog converter with the sampling mode reference voltage to determine whether the voltage of the charge on the capacitance is greater than or less than the threshold voltage; and outputting, during the sampling mode, a digital comparator signal based upon the comparing the voltage of the charge on the capacitance of the digital-to-analog converter with the sampling mode reference voltage.

Some embodiments further comprise generating a gain control signal by an automatic gain control logic based upon a frequency offset between a sampling clock frequency and an input signal frequency of the input signal, the frequency offset being determined based upon the digital comparator signal. In some embodiments, generating the gain control signal by the automatic gain control logic comprises generating the gain control signal based upon a number of samples taken during a period of a sampling cycle. In some embodiments, generating the gain control signal by the automatic gain control logic comprises generating the gain control based upon a number of samples that have been determined at a point during a sampling cycle.

Some embodiments further comprise generating a gain control signal by an automatic gain control logic based upon the digital comparator signal, wherein the gain control signal is responsive to the total composite average and peak amplitudes of the input signal as sampled by the digital-to-analog converter. In some embodiments, switching the input of the comparator to the sampling mode reference voltage comprises switching, in a single-ended, successive approximation register, analog-to-digital converter, the reference voltage input of the comparator from a conversion mode reference voltage to a sampling mode reference voltage for a duration of the sampling mode, wherein the conversion mode reference voltage comprises a threshold voltage for bit decisions and the sampling mode reference voltage comprises a threshold voltage for the input signal at the input of the comparator. Some of these embodiments further comprise switching the input signal from the sampling mode to disconnect the input signal from the digital-to-analog converter during the conversion mode and switching the reference voltage input of the comparator from the sampling mode reference voltage to apply the conversion mode reference voltage during the conversion mode. In some embodiments, coupling the input of the comparator to the sampling mode reference voltage comprises switching, in a differential, successive approximation register, analog-to-digital converter, the reference voltage input of the comparator from a differential conversion mode voltage reference to a sampling mode reference voltage for a duration of the sampling mode, wherein the conversion mode reference voltage comprises a threshold voltage for bit decisions and the sampling mode reference voltage comprises a threshold voltage for the input signal at the input of the comparator. In some embodiments, switching a successive approximation register, analog-to-digital converter comprises changing the state of a switch that is coupled between the input signal and the digital-to-analog converter. In some embodiments, comparing, during the sampling mode, the charge on the capacitance of the digital-to-analog converter with the sampling mode reference voltage comprises comparing the threshold voltage for an input of the comparator, wherein the threshold voltage is a voltage designed as the maximum voltage for the amplitude of the input signal to maintain the successive approximation register, analog-to-digital converter in linear operation.

Another example comprises an apparatus to generate feedback for automatic gain control. The apparatus may comprise a digital-to-analog converter of a successive approximation register, analog-to-digital converter; a switch to connect an input signal to the digital-to-analog converter during a sampling mode and to disconnect the input signal from the digital-to-analog converter during a conversion mode; a selection logic coupled between a sampling mode reference voltage and a second input to couple the sampling mode reference voltage to an input of a comparator during the sampling mode and to couple the second input to the input of the comparator during the conversion mode; and the comparator coupled with the digital-to-analog converter at a second input during the sampling mode to compare a voltage of the charge on a capacitance of the digital-to-analog converter with the sampling mode reference voltage, wherein the comparator comprises an output to output, during the sampling mode, a digital comparator signal based upon comparing the voltage on the charge on the capacitance of the digital-to-analog converter with the sampling mode reference voltage.

Some embodiments further comprise automatic gain control logic to generate a gain control signal based upon a frequency offset between a sampling clock frequency at which the successive approximation register, analog-to-digital converter is switched between the conversion mode and the sampling mode and an input signal frequency of the input signal, the frequency offset being determined based upon the digital comparator signal. In some embodiments, the automatic gain control logic comprises logic to generate the gain control signal based upon a number of samples taken during a period of a sampling cycle. In some embodiments, the automatic gain control logic comprises logic to generate the gain control based upon a number of samples that have been determined at a point during a sampling cycle. In some embodiments, the automatic gain control logic comprises logic to generate the gain control signal based upon the digital comparator signal, wherein the gain control signal is responsive to the total composite average and peak amplitudes of the input signal as sampled by the digital-to-analog converter. In some embodiments, the selection logic comprises logic to switch the second input of the comparator from a conversion mode reference voltage to a sampling mode reference voltage for a duration of the sampling mode, wherein the conversion mode reference voltage comprises a threshold voltage for bit decisions and the sampling mode reference voltage comprises a threshold voltage for the input signal at the input of the comparator, wherein the successive approximation register, analog-to-digital converter is a single-ended, successive approximation register. In some embodiments, the switch is adapted to switch the input signal from the sampling mode to disconnect the input signal from the digital-to-analog converter during the conversion mode and the selection logic is adapted to switch the reference voltage input of the comparator from the sampling mode reference voltage to apply the conversion mode reference voltage during the conversion mode. In some embodiments, further comprising a differential digital-to-analog converter, wherein the selection logic comprises logic to switch the second input of the comparator from a differential conversion mode reference voltage to the sampling mode reference voltage for a duration of the sampling mode, wherein the conversion mode reference voltage comprises a threshold voltage for bit decisions and the sampling mode reference voltage comprises a threshold voltage for the input signal at the input of the comparator, wherein the successive approximation register, analog-to-digital converter is a differential, successive approximation register, analog-to-digital converter. In some embodiments, the switch is coupled with the digital-to-analog converter to connect the input signal to and disconnect the input signal from the digital-to-analog converter. In some embodiments, the comparator is coupled with the digital-to-analog converter to compare, during the sampling mode, the charge on the capacitance of the digital-to-analog converter with the sampling mode reference voltage, wherein the sampling mode reference voltage is a threshold voltage for the second input of the comparator designed to maintain the successive approximation register, analog-to-digital converter in linear operation.

Another example comprises a system to generate feedback for automatic gain control. The system may comprise an antenna; and a receiver coupled with the antenna, the receiver comprising a digital-to-analog converter of a successive approximation register, analog-to-digital converter; a switch to connect an input signal to the digital-to-analog converter during a sampling mode and to disconnect the input signal from the digital-to-analog converter during a conversion mode based upon a frequency of a sampling clock; a selection logic coupled between a sampling mode reference voltage and a second input to couple the sampling mode reference voltage to an input of a comparator during the sampling mode and to couple the second input to the input of the comparator during the conversion mode; and the comparator coupled with the digital-to-analog converter at a second input during the sampling mode to compare a voltage of the charge on a capacitance of the digital-to-analog converter with the sampling mode reference voltage, wherein the comparator comprises an output to output, during the sampling mode, a digital comparator signal based upon comparing the voltage of the charge on the capacitance of the digital-to-analog converter with the sampling mode reference voltage.

Some embodiments further comprise a transmitter to transmit a wireless communication via the antenna. Some embodiments further comprise automatic gain control logic to generate a gain control signal based upon a frequency offset between a sampling clock frequency at which the successive approximation register, analog-to-digital converter is switched between the conversion mode and the sampling mode and an input signal frequency of the input signal, the frequency offset being determined based upon the digital comparator signal. Some embodiments, further comprising a differential digital-to-analog converter, wherein the selection logic comprises logic to switch the second input of the comparator from a differential conversion mode voltage reference to the sampling mode reference voltage for a duration of the sampling mode, wherein the conversion mode reference voltage comprises a threshold voltage for bit decisions and the sampling mode reference voltage comprises a threshold voltage for the input signal at the input of the comparator, wherein the successive approximation register, analog-to-digital converter is a differential, successive approximation register, analog-to-digital converter. In some embodiments, the switch is coupled with the digital-to-analog converter to connect the input signal to and disconnect the input signal from the digital-to-analog converter. In some embodiments, the selection logic comprises logic to switch the second input of the comparator from a conversion mode reference voltage to a sampling mode reference voltage for a duration of the sampling mode, wherein the conversion mode reference voltage comprises a threshold voltage for bit decisions and the sampling mode reference voltage comprises a threshold voltage for the input signal at the input of the comparator, wherein the successive approximation register, analog-to-digital converter is a single-ended, successive approximation register. And in some embodiments, the comparator is coupled with the digital-to-analog converter to compare, during the sampling mode, the charge on the capacitance of the digital-to-analog converter with the sampling mode reference voltage, wherein the sampling mode reference voltage is a threshold voltage for the second input of the comparator designed to maintain the successive approximation register, analog-to-digital converter in linear operation.

In some embodiments, some or all of the features described above and in the claims may be implemented in one embodiment. For instance, alternative features may be implemented as alternatives in an embodiment along with logic or selectable preference to determine which alternative to implement. Some embodiments with features that are not mutually exclusive may also include logic or a selectable preference to activate or deactivate one or more of the features. For instance, some features may be selected at the time of manufacture by including or removing a circuit pathway or transistor. Further features may be selected at the time of deployment or after deployment via logic or a selectable preference such as a dipswitch or the like. A user after via a selectable preference such as a software preference, a dipswitch, or the like may select still further features.

Another embodiment is implemented as a program product for implementing systems, apparatuses, and methods described with reference to FIGS. 1-3. Embodiments can take the form of an entirely hardware embodiment, a software embodiment implemented via general purpose hardware such as one or more processors and memory, or an embodiment containing both specific-purpose hardware and software elements. One embodiment is implemented in software or code, which includes but is not limited to firmware, resident software, microcode, or other types of executable instructions.

Furthermore, embodiments can take the form of a computer program product accessible from a machine-accessible, computer-usable, or computer-readable medium providing program code for use by or in connection with a computer, mobile device, or any other instruction execution system. For the purposes of this description, a machine-accessible, computer-usable, or computer-readable medium is any apparatus or article of manufacture that can contain, store, communicate, propagate, or transport the program for use by or in connection with the instruction execution system or apparatus.

The medium may comprise an electronic, magnetic, optical, electromagnetic, or semiconductor system medium. Examples of a machine-accessible, computer-usable, or computer-readable medium include memory such as volatile memory and non-volatile memory. Memory may comprise, e.g., a semiconductor or solid-state memory like flash memory, magnetic tape, a removable computer diskette, a random access memory (RAM), a read-only memory (ROM), a rigid magnetic disk, and/or an optical disk. Current examples of optical disks include compact disk-read only memory (CD-ROM), compact disk-read/write memory (CD-R/W), digital video disk (DVD)-read only memory (DVD-ROM), DVD-random access memory (DVD-RAM), DVD-Recordable memory (DVD-R), and DVD-read/write memory (DVD-R/W).

An instruction execution system suitable for storing and/or executing program code may comprise at least one processor coupled directly or indirectly to memory through a system bus. The memory may comprise local memory employed during actual execution of the code, bulk storage such as dynamic random access memory (DRAM), and cache memories which provide temporary storage of at least some code in order to reduce the number of times code must be retrieved from bulk storage during execution.

Input/output or I/O devices (including but not limited to keyboards, displays, pointing devices, etc.) can be coupled to the instruction execution system either directly or through intervening I/O controllers. Network adapters may also be coupled to the instruction execution system to enable the instruction execution system to become coupled to other instruction execution systems or remote printers or storage devices through intervening private or public networks. Modem, Bluetooth™, Ethernet, Wi-Fi, and WiDi adapter cards are just a few of the currently available types of network adapters.

What is claimed is:

1. A method, the method comprising:
   switching a successive approximation register, analog-to-digital converter from a conversion mode, to couple an input signal of the successive approximation register, analog-to-digital converter with a capacitance of a digital-to-analog converter during a sampling mode to charge the capacitance of the digital-to-analog converter in the sampling mode;
   coupling, by a selection logic, an input of a comparator to a sampling mode reference voltage for a duration of the sampling mode, wherein the sampling mode reference voltage comprises a threshold voltage for the voltage of a charge on the capacitance of the digital-to-analog converter at the input of the comparator;
   comparing, during the sampling mode, a voltage of the charge on the capacitance of the digital-to-analog converter with the sampling mode reference voltage to determine whether the voltage of the charge on the capacitance is greater than or less than the threshold voltage; and
   outputting, during the sampling mode, a digital comparator signal based upon the comparing the voltage of the charge on the capacitance of the digital-to-analog converter with the sampling mode reference voltage.

2. The method of claim 1, further comprising generating a gain control signal by an automatic gain control logic based upon a frequency offset between a sampling clock frequency and an input signal frequency of the input signal, the frequency offset being determined based upon the digital comparator signal.

3. The method of claim 2, wherein generating the gain control signal by the automatic gain control logic comprises generating the gain control signal based upon a number of samples taken during a period of a sampling cycle.

4. The method of claim 2, wherein generating the gain control signal by the automatic gain control logic comprises generating the gain control based upon a number of samples that have been determined at a point during a sampling cycle.

5. The method of claim 1, further comprising generating a gain control signal by an automatic gain control logic based upon the digital comparator signal, wherein the gain control signal is responsive to the total composite average and peak amplitudes of the input signal as sampled by the digital-to-analog converter.

6. The method of claim 1, wherein switching the input of the comparator to the sampling mode reference voltage comprises switching, in a single-ended, successive approximation register, analog-to-digital converter, the reference voltage input of the comparator from a conversion mode reference voltage to a sampling mode reference voltage for a duration of the sampling mode, wherein the conversion mode reference voltage comprises a threshold voltage for bit decisions and the sampling mode reference voltage comprises a threshold voltage for the input signal at the input of the comparator.

7. The method of claim 6, further comprising:
   switching the input signal from the sampling mode to disconnect the input signal from the digital-to-analog converter during the conversion mode and
   switching the reference voltage input of the comparator from the sampling mode reference voltage to apply the conversion mode reference voltage during the conversion mode.

8. The method of claim 1, wherein coupling the input of the comparator to the sampling mode reference voltage comprises switching, in a differential, successive approximation register, analog-to-digital converter, the reference voltage input of the comparator from a differential conversion mode voltage reference to a sampling mode reference voltage for a duration of the sampling mode, wherein the conversion mode reference voltage comprises a threshold voltage for bit decisions and the sampling mode reference voltage comprises a threshold voltage for the input signal at the input of the comparator.

9. The method of claim 1, wherein switching a successive approximation register, analog-to-digital converter comprises changing the state of a switch that is coupled between the input signal and the digital-to-analog converter.

10. The method of claim 1, wherein comparing, during the sampling mode, the charge on the capacitance of the digital-to-analog converter with the sampling mode reference voltage comprises comparing the threshold voltage for an input of the comparator, wherein the threshold voltage is a voltage designed as the maximum voltage for the amplitude of the input signal to maintain the successive approximation register, analog-to-digital converter in linear operation.

11. An apparatus comprising:
a digital-to-analog converter of a successive approximation register, analog-to-digital converter;
a switch to connect an input signal to the digital-to-analog converter during a sampling mode and to disconnect the input signal from the digital-to-analog converter during a conversion mode;
a selection logic coupled between a sampling mode reference voltage and a second input to couple the sampling mode reference voltage to an input of a comparator during the sampling mode and to couple the second input to the input of the comparator during the conversion mode; and
the comparator coupled with the digital-to-analog converter at a second input during the sampling mode to compare a voltage of the charge on a capacitance of the digital-to-analog converter with the sampling mode reference voltage, wherein the comparator comprises an output to output, during the sampling mode, a digital comparator signal based upon comparing the voltage on the charge on the capacitance of the digital-to-analog converter with the sampling mode reference voltage.

12. The apparatus of claim 11, further comprising automatic gain control logic to generate a gain control signal based upon a frequency offset between a sampling clock frequency at which the successive approximation register, analog-to-digital converter is switched between the conversion mode and the sampling mode and an input signal frequency of the input signal, the frequency offset being determined based upon the digital comparator signal.

13. The apparatus of claim 12, wherein the automatic gain control logic comprises logic to generate the gain control signal based upon a number of samples taken during a period of a sampling cycle.

14. The apparatus of claim 12, wherein the automatic gain control logic comprises logic to generate the gain control based upon a number of samples that have been determined at a point during a sampling cycle.

15. The apparatus of claim 12, wherein the automatic gain control logic comprises logic to generate the gain control signal based upon the digital comparator signal, wherein the gain control signal is responsive to the total composite average and peak amplitudes of the input signal as sampled by the digital-to-analog converter.

16. The apparatus of claim 11, wherein the selection logic comprises logic to switch the second input of the comparator from a conversion mode reference voltage to a sampling mode reference voltage for a duration of the sampling mode, wherein the conversion mode reference voltage comprises a threshold voltage for bit decisions and the sampling mode reference voltage comprises a threshold voltage for the input signal at the input of the comparator, wherein the successive approximation register, analog-to-digital converter is a single-ended, successive approximation register.

17. The apparatus of claim 16, wherein:
the switch is adapted to switch the input signal from the sampling mode to disconnect the input signal from the digital-to-analog converter during the conversion mode and
the selection logic is adapted to switch the reference voltage input of the comparator from the sampling mode reference voltage to apply the conversion mode reference voltage during the conversion mode.

18. The apparatus of claim 11, further comprising a differential digital-to-analog converter, wherein the selection logic comprises logic to switch the second input of the comparator from a differential conversion mode reference voltage to the sampling mode reference voltage for a duration of the sampling mode, wherein the conversion mode reference voltage comprises a threshold voltage for bit decisions and the sampling mode reference voltage comprises a threshold voltage for the input signal at the input of the comparator, wherein the successive approximation register, analog-to-digital converter is a differential, successive approximation register, analog-to-digital converter.

19. The apparatus of claim 11, wherein the switch is coupled with the digital-to-analog converter to connect the input signal to and disconnect the input signal from the digital-to-analog converter.

20. The apparatus of claim 11, wherein the comparator is coupled with the digital-to-analog converter to compare, during the sampling mode, the charge on the capacitance of the digital-to-analog converter with the sampling mode reference voltage, wherein the sampling mode reference voltage is a threshold voltage for the second input of the comparator designed to maintain the successive approximation register, analog-to-digital converter in linear operation.

21. A system comprising:
an antenna; and
a receiver coupled with the antenna, the receiver comprising:
a digital-to-analog converter of a successive approximation register, analog-to-digital converter;
a switch to connect an input signal to the digital-to-analog converter during a sampling mode and to disconnect the input signal from the digital-to-analog converter during a conversion mode based upon a frequency of a sampling clock;
a selection logic coupled between a sampling mode reference voltage and a second input to couple the sampling mode reference voltage to an input of a comparator during the sampling mode and to couple the second input to the input of the comparator during the conversion mode; and
the comparator coupled with the digital-to-analog converter at a second input during the sampling mode to compare a voltage of the charge on a capacitance of the digital-to-analog converter with the sampling mode reference voltage, wherein the comparator comprises an output to output, during the sampling mode, a digital comparator signal based upon comparing the voltage of the charge on the capacitance of the digital-to-analog converter with the sampling mode reference voltage.

22. The system of claim 21, further comprising a transmitter to transmit a wireless communication via the antenna.

23. The system of claim 21, further comprising mode logic coupled with the switch to establish a frequency of switching between the sampling mode and the conversion mode.

24. The system of claim 21, further comprising automatic gain control logic to generate a gain control signal based upon a frequency offset between a sampling clock frequency at which the successive approximation register, analog-to-digital converter is switched between the conversion mode and the sampling mode and an input signal frequency of the input signal, the frequency offset being determined based upon the digital comparator signal.

25. The system of claim 21, further comprising a differential digital-to-analog converter, wherein the selection logic comprises logic to switch the second input of the comparator from a differential conversion mode voltage reference to the sampling mode reference voltage for a duration of the sampling mode, wherein the conversion mode reference voltage comprises a threshold voltage for bit decisions and the sampling mode reference voltage comprises a threshold voltage for the input signal at the input of the comparator, wherein the successive approximation register, analog-to-digital converter is a differential, successive approximation register, analog-to-digital converter.

26. The system of claim 21, wherein the switch is coupled with the digital-to-analog converter to connect the input signal to and disconnect the input signal from the digital-to-analog converter.

27. The system of claim 21, wherein the selection logic comprises logic to switch the second input of the comparator from a conversion mode reference voltage to a sampling mode reference voltage for a duration of the sampling mode, wherein the conversion mode reference voltage comprises a threshold voltage for bit decisions and the sampling mode reference voltage comprises a threshold voltage for the input signal at the input of the comparator, wherein the successive approximation register, analog-to-digital converter is a single-ended, successive approximation register.

28. The system of claim 21, wherein the comparator is coupled with the digital-to-analog converter to compare, during the sampling mode, the charge on the capacitance of the digital-to-analog converter with the sampling mode reference voltage, wherein the sampling mode reference voltage is a threshold voltage for the second input of the comparator to maintain the successive approximation register, analog-to-digital converter in linear operation.

* * * * *